United States Patent [19]

Cannizzaro, Jr.

[11] Patent Number: 5,374,325
[45] Date of Patent: Dec. 20, 1994

[54] LIQUID AGITATION AND PURIFICATION SYSTEM

[75] Inventor: Stephen J. Cannizzaro, Jr., Boise, Id.

[73] Assignee: VLSI Technology, Inc., San Jose, Calif.

[21] Appl. No.: 140,736

[22] Filed: Oct. 21, 1993

Related U.S. Application Data

[62] Division of Ser. No. 931,088, Aug. 13, 1992, Pat. No. 5,282,923.

[51] Int. Cl.$^5$ ............................................. B44C 1/22
[52] U.S. Cl. .................................. 156/345; 156/637
[58] Field of Search ............... 156/637, 638, 639, 642, 156/657, 662, 345; 134/10, 34

[56] References Cited

U.S. PATENT DOCUMENTS

| | | | |
|---|---|---|---|
| 3,863,333 | 2/1975 | Loya | 156/637 X |
| 4,501,636 | 2/1985 | Valley | 156/637 X |
| 4,554,046 | 11/1985 | Taguchi et al. | 156/637 X |
| 4,675,067 | 6/1987 | Valley | 156/345 |
| 4,980,017 | 12/1990 | Kaji et al. | 156/642 |

*Primary Examiner*—William Powell
*Attorney, Agent, or Firm*—Majestic, Parsons, Siebert & Hsue

[57] ABSTRACT

Semiconductor wafers are vertically loaded into a cassette, the cassette is placed on a support structure, the cassette and support structure are placed in a drop-in tank, and the drop-in tank is placed inside a larger tank containing etching solution. Holes in the drop-in tank allow the etching solution in the larger tank to enter and fill the drop-in tank. A pump sucks etching solution out of the larger tank and as a result, also sucks etching solution out of the drop-in tank through the holes. The pumped out solution is then filtered of residue waste resulting from the etching process, and the filtered solution is pumped into a hollow portion of the support structure and from thence, out of the hollow portion through holes formed on a top surface of the support structure, generating thereby, currents of filtered etching solution. The currents of etching solution then flow into an open bottom of the cassette, flow past the vertically hanging semiconductor wafers, and flow out of an open top of the cassette, carrying along with them, the residue waste resulting from the etching process. The residue waste then sinks to the bottom of the drop-in tank and is subsequently sucked out by the pump, along with the etching solution, through the holes in the drop-in tank. The pumped out solution is then filtered and recirculated back into the drop-in tank through the support structure as previously described.

13 Claims, 2 Drawing Sheets

LIQUID AGITATION AND PURIFICATION SYSTEM

This is a divisional of application Ser. No. 07/931,088 filed Aug. 13, 1992, now U.S. Pat. No. 5282,923.

BACKGROUND OF THE INVENTION

This invention relates in general to semiconductor wafer processing and in particular, to an apparatus and method for enhancing a stripping or etching step in the process wherein a layer or layers, or portions of a layer or layers of a semiconductor wafer are selectively stripped or etched away by an etching solution.

During batch processing of semiconductor wafers, selective stripping or etching away of a layer or portions of a layer or layers of the wafers is required. A conventional technique immerses a plurality of wafers into an etching solution, and then mechanically moves the plurality of wafers in an up/down and/or back/forth agitating motion to enhance the stripping or etching away process.

One problem with this technique is that the etching solution remains stagnant and eventually becomes saturated with stripped or etched away material near the wafer surfaces. Consequently, the stripping or etching process becomes less effective over time and eventually, the etching solution must be replaced.

Another problem is that a mechanical means for providing the up/down and/or back/forth agitation motion may be expensive, bulky and subject to mechanical break down. As a consequence, this may add to the processing cost of the wafers which would result in more expensive integrated circuits, and may increase the likelihood of line stoppages which would result in manufacturing delays.

OBJECTS AND SUMMARY OF THE INVENTION

Accordingly, one object of the present invention is to provide an apparatus and method for providing agitating motion to an etching solution wherein one or more wafers are immersed, such that the currents formed by the agitating motion cause the solution to flow against the wafers in such a fashion as to enhance a selective stripping or etching away process on the wafers without using mechanical means to move the wafers.

Another object is to provide an apparatus and method for providing agitating motion to an etching solution wherein one or more wafers are immersed, such that the currents formed by the agitating motion cause the solution to flow against the wafers in such a fashion as to enhance a selective stripping or etching away process on the wafers without accumulating stripped or etched away material near the wafer surfaces.

Another object is to provide an apparatus and method for providing agitating motion to an etching solution wherein one or more wafers are immersed, such that the currents formed by the agitating motion cause the solution to flow against the wafers in such a fashion as to enhance a selective stripping or etching away process on the wafers without requiring stoppage of the manufacturing process in order to replace the solution during the process.

These and additional objects are accomplished by the various aspects of the present invention, wherein briefly stated, one aspect of the invention accomplishes one or more of these objects by an apparatus for stripping or etching away an exposed portion of a layer on a planar surface of at least one semiconductor wafer. The apparatus comprises means for holding and positioning the at least one semiconductor wafer in a container of etching solution, and means for agitating the etching solution so as to enhance the stripping or etching away of the exposed portion of a layer. The at least one semiconductor wafer is thus held stationary by the holding and positioning means while the etching solution is being agitated and the exposed portion of a layer of the at least one semiconductor wafer chemically reacts with the etching solution.

In the preferred embodiment, the apparatus includes means for holding and positioning the semiconductor wafers, means for supporting the holding and positioning means in the container of etching solution, means for removing stripped or etched away residue away from the semiconductor wafers, means for filtering the etching solution during the stripping or etching process, and means for directing the filtered etching solution across the planar surfaces of the semiconductor wafers.

In particular, a preferred embodiment of the supporting means includes a structure having a hollow interior, an inlet port, and a plurality of current directing holes. The plurality of current directing holes extend through the hollow interior to a top surface of the support structure.

Thereupon, a preferred embodiment of the means for holding and positioning the semiconductor wafers is placed upon the top surface of the support structure in such a fashion that liquid flowing out of the plurality of current directing holes enters an opening in the bottom of the holding and positioning means, and from thence, flows in a perpendicular direction to and past the planar surfaces of the semiconductor wafers being held in the holding and positioning means, and exits through an opening in the top of the holding and positioning means.

A preferred embodiment of the removing means includes a drop-in tank which drops into a larger tank holding the etching solution, an outlet pipe placed in the larger tank, but outside of the drop-in tank, and a pump connected to the outlet pipe. The wafers, the holding and positioning means holding the wafers, and the support structure supporting the holding and positioning means are placed inside the drop-in tank. When the drop-in tank is placed in the larger tank holding the etching solution, the solution enters the drop-in tank through a plurality of holes formed near the bottom edges of all four side walls of the drop-in tank.

The plurality of holes formed near the bottom edges of the drop-in tank also serve as escape holes for the stripped or etched away residue from the wafers. As the etching solution in the drop-in tank acts to selectively strip or etch away a layer, or portions of a layer or layers of the wafers, the stripped or etched away residue sinks to the bottom of the drop-in tank. Thereafter, a pumping action from the pump sucks etching solution out of the larger tank through the outlet pipe, and that same action sucks the stripped or etched away residue at the bottom of the drop-in tank out of the drop-in tank and onto the bottom of the larger tank through the plurality of holes near the bottom edges of the drop-in tank.

A preferred embodiment of the drop-in tank includes in addition to the plurality of holes formed near the bottom edges of all four side walls of the drop in tank, a plurality of feet supporting the drop-in tank, and a plurality of fluid overflow holes formed near the top edges of all four side walls of the drop-in tank. The feet of the drop-in tank serve the dual purposes of allowing currents of etching solution to flow underneath the drop-in tank after it has been placed inside the larger tank to promote circulation of the solution, and allowing residue which has been stripped or etched away from the wafers to form piles on the bottom floor of the larger tank without blocking the plurality of holes near the bottom edges of the drop-in tank. The plurality of fluid overflow holes serve the purpose of preventing the etching solution in the drop-in tank to raise to unacceptably high levels by allowing the solution to overflow out of the drop-in tank and into the larger tank in the event that the purified etching solution being pumped into the drop-in tank through the support structure raises the level of fluid in the drop-in tank to the level of the overflow holes.

Another aspect of the invention is a method for providing agitation to and purification of an etching solution used for selectively stripping or etching away an exposed portion of a layer on each of one or more semiconductor wafers. The method includes positioning the semiconductor wafers in a container of etching solution, and agitating the solution in such a manner as to cause a current of the solution to flow adjacent to the wafers and thereby, enhance the stripping or etching away process.

Still another aspect of the present invention includes in addition to the above method, filtering the etching solution and generating a current of the filtered solution to flow adjacent to the portion of a layer which is to be stripped or etched away on each of the semiconductor wafers, in such a manner as to enhance the stripping or etching away process.

Additional objects, features and advantages of the various aspects of the present invention will become apparent from the following description of its preferred embodiment, which description should be taken in conjunction with the accompanying drawings.

DESCRIPTION OF THE PREFERRED EMBODIMENT

Figure 1:
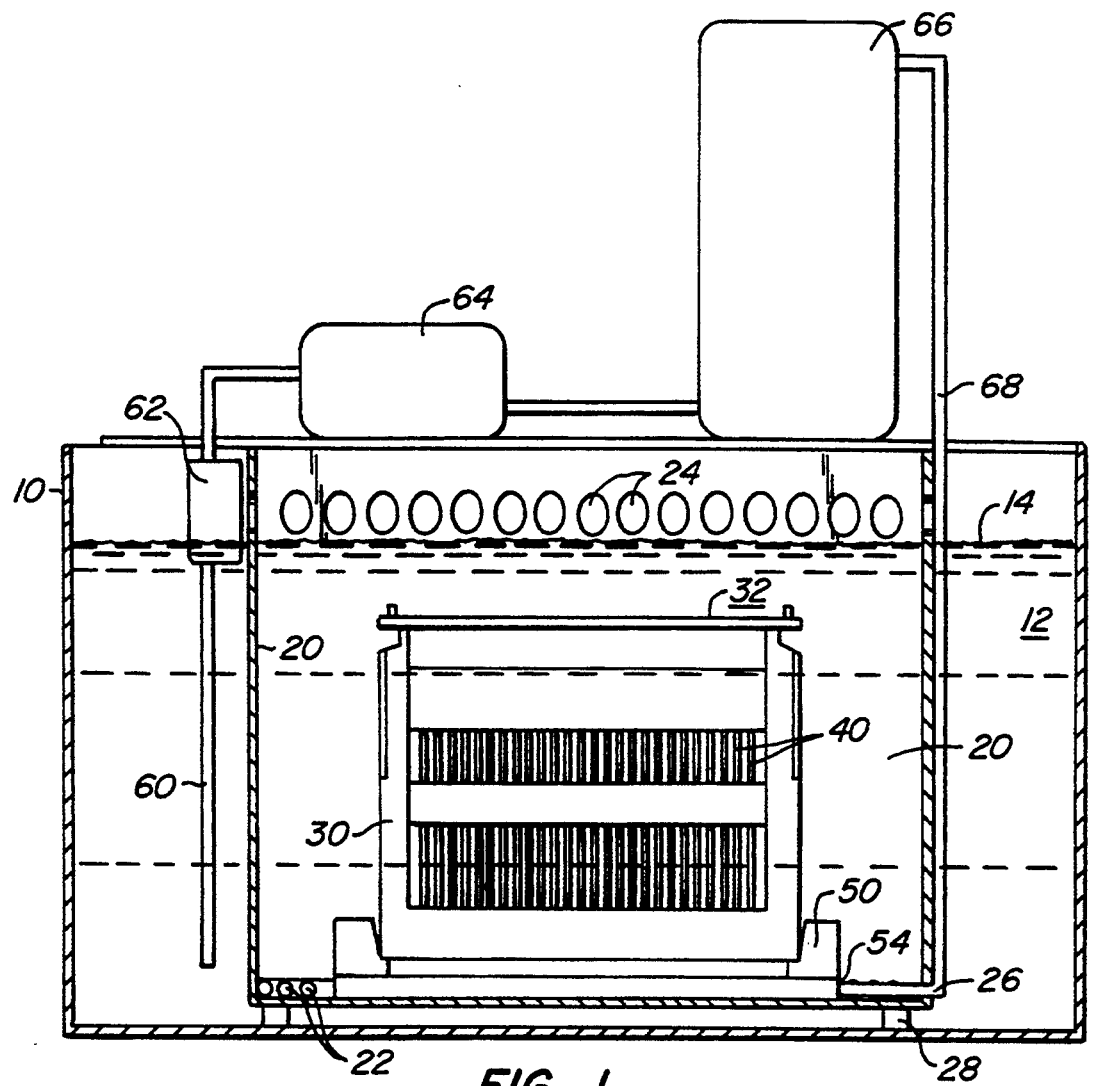
FIG. 1 illustrates a side elevational view of an apparatus, utilizing aspects of the present invention, which provides both agitating motion to an etching solution wherein a cassette of wafers is immersed, and continuous purification of the solution.
Figure 2:
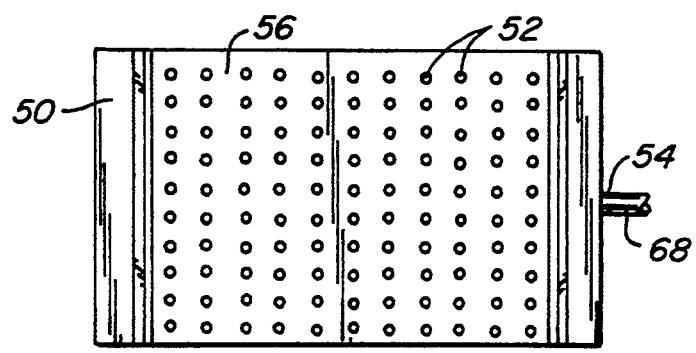
FIG. 2 illustrates a top plan view of a cassette support structure, utilizing aspects of the present invention, which is part of the apparatus shown in FIG. 1.
Figure 3:
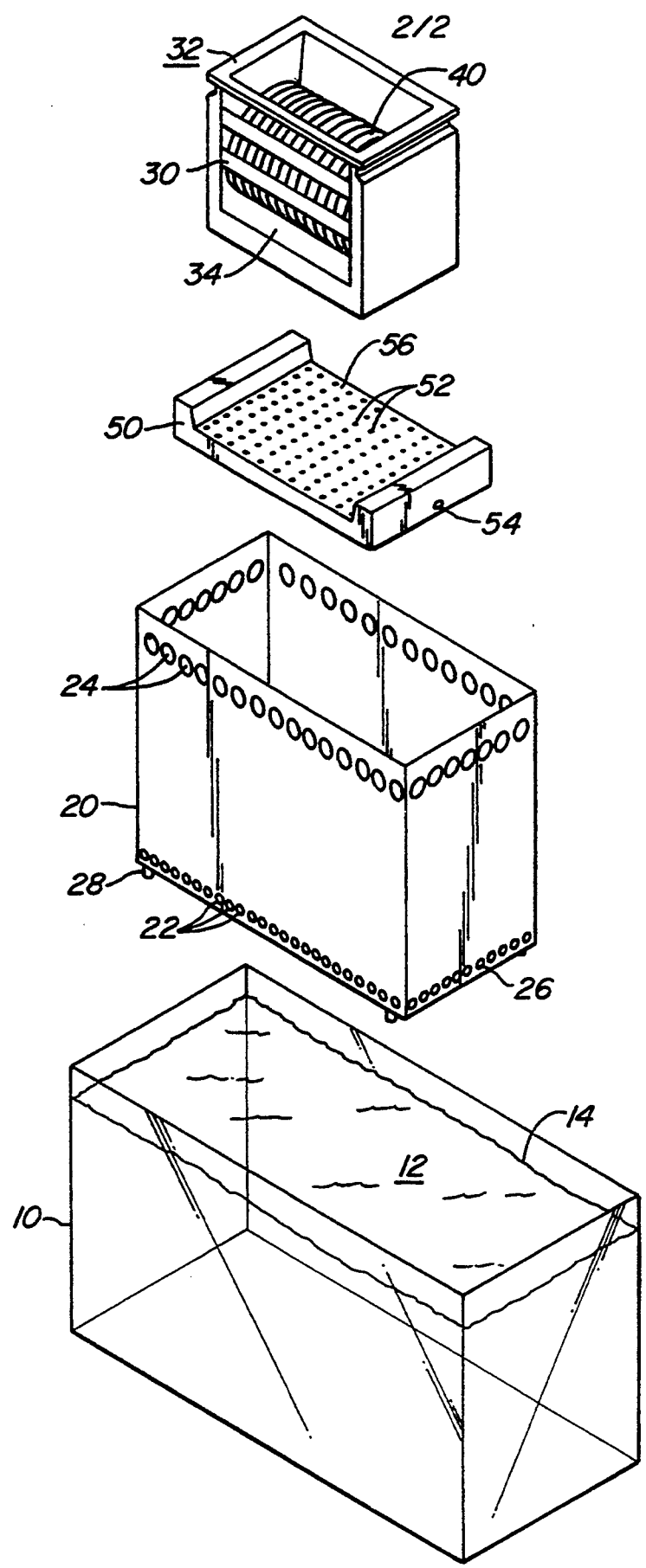
FIG. 3 illustrates an exploded perspective view of parts of the apparatus shown in FIG. 1.

FIGS. 1–3 illustrate an apparatus utilizing aspects of the present invention. A drop-in tank 20 having a plurality of holes 22 formed near the bottom edges of its four side walls and a plurality of holes 24 formed near the top edges of its four side walls, is placed into a tank 10 containing an etching solution 12. The drop-in tank 20 stands on feet 28 formed on its bottom surface. Etching solution from the tank 10 enters the drop-in tank 20 through the plurality of holes 22 formed near the bottom edges of its four side walls, and rises to a level 14 which is just below the plurality of holes 24.

A plurality of wafers 40 are loaded vertically into a cassette 30 which has large openings formed in both its top and bottom surfaces, 32 and 34, respectively. The loaded cassette 30 is then placed upon a support structure 50 such that the bottom surface 34 of the cassette 30 sits on a top surface 56 of the support structure 50. Both the loaded cassette 30 and the support structure 50 are placed in the drop-in tank 20. Placement of the loaded cassette 30 and the support structure 50 into the drop-in tank 20 can occur prior to or after the drop-in tank 20 is placed into the larger tank 10 containing the etching solution 12.

After immersion of the loaded cassette 30, the support structure 50, and the drop-in tank 20 into the larger tank 10 containing the etching solution 12, and after the resultant filling of the drop-in tank 20 with the etching solution 12 as previously described, the etching solution 12 then acts upon the exposed layer or layers, or portions of a layer or layers of the plurality of wafers 40 and as a result, stripped or etched away material (also referred to herein as "residue") peel off the wafers and eventually sink to the bottom of the drop-in tank 20.

Referring now to FIG. 1, an outlet pipe 60 is placed in the larger tank 10, but outside of the drop-in tank 20. The outlet pipe 60 is then connected directly to a pump 64 or optionally (as shown in FIG. 1), to a pre-filter 62 which is in turn, connected to the pump 64.

The pump 64 acts to suck part of the etching solution 12 out of the larger tank 10. As a result of this sucking action, currents are generated in the larger tank 10 which flow towards the outlet pipe 60. Also as a result of this sucking action, currents are generated in the drop-in tank 20, and flow through the holes 22 of the drop-in tank 20 and from there, towards the outlet pipe 60.

In addition to the etching solution in the drop-in tank 20, residue from the wafers 40 are also swept through the holes 22 by the currents generated by the sucking action of the pump 64. These currents are especially effective in sweeping out of the drop-in tank 20, the residue which has accumulated on the bottom of the drop-in tank 20. This is because the piles of accumulated residue on the bottom of the drop-in tank 20 are not only in close proximity to the holes 22, but they are also in the direct path of the currents flowing through the holes 22 which have been purposely formed near the bottom of the drop-in tank 20. In addition, these currents also act to sweep out of the drop-in tank 20, some of the residue which might be still floating in the solution of the drop-in tank 20.

Again referring to FIG. 1, a filter 66 is connected to the output of the pump 64. The purpose of the filter 66, is to filter out the residue from the etching solution which has been sucked through the outlet pipe 60 by the pump 64. If an optional pre-filter 62 is also included in the system, the filtering action is conducted by both the pre-filter 62 which conducts coarse filtering for large residue particles before the residue and solution reach the pump 64, and the filter 66 which would then conduct fine filtering for small residue particles. If no optional pre-filter 62 is included in the system, the filter 66 must conduct both coarse and fine filtering functions. In the preferred embodiment of the invention, the optional pre-filter 62 is not included.

An inlet line 68 is then connected at one end to the output of the filter 66, is immersed into the larger tank 10, is passed through a hole 26 formed in the drop-in tank 20, and is connected at the other end to an inlet port 54 of the support structure 50. The hole 26 may be a specially formed hole to accomodate the size of the inlet line 68, or it may merely be one of the holes 22. Alternatively, the inlet line 68 can also be immersed directly into the drop-in tank 20 and as a result, making it unnecessary to pass the inlet line 68 through a hole in the drop-in tank 20.

Now referring to FIGS. 2 and 3, the support structure 50 has a hollow interior with only its inlet port 54 and a plurality of current directing holes 52 allowing access into and out of the hollow interior. In FIG. 2, which shows a top plan view of the support structure 50, the plurality of current directing holes 52 are shown to be formed in pattern of rows and columns on the top surface 56 of the support structure 50. For reasons that will become subsequently clearer, the columns of holes formed on the top surface 56 of the support structure 50 are preferably parallel with the vertically hanging wafers 40 in the cassette 30 as the loaded cassette 30 sits upon the top surface 56 of the support structure 50, and each column of holes is preferably between adjacent, vertically hanging wafers.

Now referring back to FIG. 1, the apparatus is shown to generate a current of purified etching solution which flows past the vertically hanging wafers 40 to enhance the stripping or etching action of the etching solution in the drop-in tank 20. The pump 64 pumps purified etching solution out of the filter 66, through the inlet line 68, into the hollow interior of the support structure 50, through the current directing holes 52, through the large opening in the bottom surface 34 of the loaded cassette 30, past the vertically hanging wafers 40, through the large opening in the top surface 32 of the loaded cassette 30, and from thence, out of the loaded cassette 30 and into the remaining portion of the drop-in tank 20.

The upward current of purified etching solution which flows past and substantially parallel to the planar surfaces of the vertically hanging wafers 40, not only enhances the stripping or etching process, but also picks up the resulting residue from the etching process and carries it out of the cassette 30. After being "blown" out through the top surface 32 of the cassette 30, the residue is then "thrown" towards the side walls of the drop-in tank 20 and eventually sinks towards the bottom of the drop-in tank 20 near the holes 22 which have been purposely formed near the bottom edges of all four side walls of the drop-in tank 20.

To maximize the speed of the current generated by the pumping action and enhance the agitating motion of the solution against the wafers 40, the flow preferably is not impeded by physical barriers such as the wafers themselves. As previously mentioned, the locations of the current directing holes 52 of the support structure 50, preferably are parallel to and formed in columns between adjacent, vertically hanging wafers. If they are not, the currents of purified solution shooting out of the current directing holes 52 may be impeded by striking the bottoms of the vertically hanging wafers.

Although the various aspects of the present invention have been described with respect to a preferred embodiment, it will be understood that the invention is entitled to full protection within the full scope of the appended claims.

What is claimed is:

1. An apparatus for stripping or etching away an exposed portion of a layer on at least one semiconductor wafer, comprising:

means for holding and positioning said at least one semiconductor wafer in a container of etching solution; and means for agitating said etching solution so as to enhance the stripping or etching away of said exposed portion of a layer, wherein said at least one semiconductor wafer remains stationary while said etching solution is being agitated and said exposed portion of a layer chemically reacts with said etching solution; and means for removing stripped or etched away material from said container of etching solution.

2. The apparatus as claimed in claim 1, further comprising means for filtering stripped or etched away material out of said etching solution, while said etching solution is being agitated.

3. The apparatus as claimed in claim 1, further comprising means for supporting said holding and positioning means in said container of etching solution.

4. The apparatus as claimed in claim 3, wherein said supporting means comprises a structure, said structure having a hollow interior, an inlet port and a plurality of holes, said hollow interior only being accessible by said inlet port and said plurality of holes.

5. The apparatus as claimed in claim 1, wherein said holding and positioning means comprises a structure having top and bottom surfaces, wherein each of said surfaces has an opening through which currents of etching solution are free to flow.

6. The apparatus as claimed in claim 5, said at least one semiconductor wafer having a planar surface and said exposed portion of a layer being on said planar surface, wherein said holding and positioning means holds said at least one semiconductor wafer in a position such that said planar surface is perpendicular to said top and bottom surfaces of said holding and positioning means structure.

7. The apparatus as claimed in claim 6, wherein said agitating means generates a current of etching solution that flows through said openings of said top and bottom surfaces of said holding and positioning means structure and in a parallel direction with said planar surface of said at least one semiconductor wafer.

8. The apparatus as claimed in claim 7, further comprising a support structure, said support structure having a hollow interior, an inlet port and a plurality of holes, said hollow interior only being accessible by said inlet port and said plurality of holes.

9. The apparatus as claimed in claim 8, wherein said plurality of holes is formed in a top surface of said support structure, and said holding and positioning means is placed on said support structure such that said bottom surface of said holding and positioning means structure is adjacent to said top surface of said support structure.

10. The apparatus as claimed in claim 9, further comprising:

means for pumping said etching solution out of said container, wherein said pumped out etching solution contains stripped or etched away material;

means connected to said pumping means for filtering out said stripped or etched away material from said pumped out etching solution; and means connected to said filtering means and said inlet port of said support structure, for generating currents of filtered etching solution out of said plurality of holes in said top surface of said support structure;

wherein said generated currents of filtered etching solution flow into said opening in said bottom surface of said holding and positioning means structure, flow in parallel directions with said planar surface of said at least one semiconductor wafer, and flow out of said opening in said top surface of said holding and positioning means structure, and carry along with them, material stripped or etched away from said at least one semiconductor wafer by said etching solution.

11. An apparatus for providing agitation to and purification of an etching solution used for stripping or etching away an exposed portion of a layer on a planar surface of each of a plurality of semiconductor wafers, comprising:

a container containing said etching solution, said container having a top, a plurality of sides, a bottom, and a plurality of feet, at least one of said plurality of sides having a first plurality of holes formed near an interstice formed where said at least one of said plurality of sides is connected to said bottom;

means for holding and positioning said plurality of semiconductor wafers, said holding and positioning means having top and bottom sides, each of said sides having an opening through which currents of etching solution are free to flow, said plurality of semiconductor wafers being held and positioned by said holding and positioning means so that said planar surface of each of said plurality of semiconductor wafers is perpendicular to said top and bottom sides of said holding and positioning means;

a support structure for supporting said holding and positioning means in said container containing said etching solution, said support structure having a hollow interior, an inlet port, and a plurality of holes, said hollow interior only being accessible through said inlet port and said plurality of holes, said plurality of holes being formed on a top surface of said support structure, wherein said holding and positioning means is placed in contact with said support structure such that said bottom side of said holding and positioning means is adjacent to said top surface of said support structure;

a tank containing etching solution, said container being placed in said tank with said holding and positioning means and said support structure being placed in said container, said etching solution in said tank free to intermix with said said etching solution in said container through said first plurality of holes formed in said container;

means for pumping etching solution out of said container;

means connected to said pumping means for filtering stripped or etched away material out of said pumped out etching solution; and means connected to said filtering means and said inlet port of said support structure, for generating currents of filtered etching solution out of said plurality of holes in said top surface of said support structure;

wherein said generated currents of filtered etching solution flow into said opening in said bottom surface of said holding and positioning means, flow in parallel directions with said planar surface of said at least one semiconductor wafer, and flow out of said opening in said top surface of said holding and positioning means, and carry along with them, material stripped or etched away from said exposed portion of a layer on a planar surface of each of said plurality of semiconductor wafers by said etching solution.

12. The apparatus as claimed in claim 11, wherein at least one of said plurality of sides of said container has a second plurality of holes formed near an interstice formed where said at least one of said plurality of sides is connected to said open top of said container.

13. The apparatus as claimed in claim 11, wherein said pumping means comprises:

an outlet pipe immersed in said tank; and a pump connected to said outlet pipe, wherein said pump sucks etching solution out of said container through said first plurality of holes in said container and from thence, toward said outlet pipe, carrying along with it said stripped or etched away material.

* * * * *